United States Patent
Tsuduki et al.

(10) Patent No.: US 7,955,903 B2
(45) Date of Patent: Jun. 7, 2011

(54) METHOD OF SUPPRESSING OVERFLOWING OF AN ENCAPSULATION RESIN IN A SEMICONDUCTOR MODULE

(75) Inventors: Koji Tsuduki, Kawasaki (JP); Takanori Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 39 days.

(21) Appl. No.: 12/490,656

(22) Filed: Jun. 24, 2009

(65) Prior Publication Data
US 2009/0298237 A1 Dec. 3, 2009

Related U.S. Application Data

(62) Division of application No. 11/955,504, filed on Dec. 13, 2007, now Pat. No. 7,622,812.

(30) Foreign Application Priority Data
Dec. 27, 2006 (JP) .................................. 2006-351926

(51) Int. Cl.
H01L 21/00 (2006.01)
H01L 23/48 (2006.01)

(52) U.S. Cl. ......... 438/125; 438/599; 257/773; 257/787

(58) Field of Classification Search .................. None
See application file for complete search history.

(56) References Cited

U.S. PATENT DOCUMENTS

| | | | |
|---|---|---|---|
| 6,101,098 A | 8/2000 | Noda | 361/760 |
| 6,710,458 B2 | 3/2004 | Seko | 257/778 |
| 6,853,089 B2 | 2/2005 | Ujiie et al. | 257/783 |
| 6,998,532 B2 | 2/2006 | Kawamoto et al. | 174/52.2 |
| 7,149,091 B2 | 12/2006 | Ochi et al. | 361/765 |
| 7,622,812 B2 * | 11/2009 | Tsuduki et al. | 257/787 |
| 2003/0052419 A1 | 3/2003 | Ujiie et al. | 257/787 |
| 2006/0091523 A1 | 5/2006 | Shimanuki | 257/698 |

FOREIGN PATENT DOCUMENTS

| | | |
|---|---|---|
| CN | 1779951 A | 5/2006 |
| JP | 11-135685 A | 5/1999 |
| JP | 2004-327851 A | 11/2004 |

* cited by examiner

*Primary Examiner* — Alonzo Chambliss
(74) *Attorney, Agent, or Firm* — Fitzpatrick, Cella, Harper & Scinto

(57) ABSTRACT

A semiconductor module includes a semiconductor chip sealed with an encapsulation resin prevented from overflowing from an inside of the outer edge by a wiring pattern extended portion extending from the wiring pattern along an outer edge of a solder resist pattern at an outside of the outer edge of the solder resist pattern.

8 Claims, 5 Drawing Sheets

AREA IN WHICH STEP SHAPE IS
HARDLY BE FORMED

METHOD OF SUPPRESSING OVERFLOWING OF AN ENCAPSULATION RESIN IN A SEMICONDUCTOR MODULE

CROSS REFERENCE TO RELATED APPLICATION

The present application is a division of U.S. application Ser. No. 11/955,504, filed on Dec. 13, 2007 now U.S. Pat. No. 7,622,812, the entire disclosure of which is incorporated by reference herein.

BACKGROUND OF THE INVENTION

1. Field of the Invention

The present invention relates to a semiconductor module configured to seal a semiconductor chip mounted on a substrate using an encapsulation resin. More particularly, the present invention relates to a semiconductor module having a structure for suppressing overflowing of the encapsulation resin from a predetermined region of the substrate when sealing the semiconductor chip with the encapsulation resin.

2. Description of the Related Art

Recently, as electronic devices have undergone reduction in thickness and size, needs for reduction in weight and thickness have increased sharply for semiconductor modules constituting the electronic devices. One of semiconductor module mounting methods for satisfying these needs is COB (Chip On Board), which has come into practical use in many fields as is known.

Generally, the semiconductor module of COB type is constructed such that a semiconductor chip is mounted and fixed on a substrate on which a wiring pattern has been formed, the semiconductor chip is then connected to a wiring pattern, and the semiconductor chip is then sealed with an encapsulation resin so as to completely cover the semiconductor chip, a gold wire and a bonding connecting portion. Connection of the semiconductor chip to the wiring pattern is established by, for example, wire bonding by a gold wire.

As an encapsulation resin, an encapsulation resin having flowability, such as an epoxy resin, is generally used not only for sealing all the parts but also for employing a method of high-yield production such as a dispenser method or a printing method.

However, use of an encapsulation resin having flowability, such as an epoxy resin, has a disadvantage that the encapsulation resin flows out to an unintended area, so that a resin region cannot be formed within a certain area. This has been a factor of hindering further reduction in size.

For solving the problems described above, various methods were proposed in the past. They include, for example, a method in which a silk dam is formed on the periphery of a chip to provide a bank, a method in which a mold is provided, a resin is poured into the mold, the resin is then cured and the mold is removed, and a method in which a bank-shaped pattern is formed with a solder resist coated on the surface of a substrate to provide a stemming structure.

Above all, the method by a solder resist is very effective, since there is no additional cost element and the solder resist can be easily formed in the substrate production process. The structure is discussed in, for example, Japanese Patent Application Laid-Open No. H11-135685.

FIGS. 7A and 7B illustrate a schematic diagram of a semiconductor module having the resin stemming structure discussed in Japanese Patent Application Laid-Open No. H11-135685. FIG. 7A is a plan view and FIG. 7B is a sectional view taken along line 7B-7B in FIG. 7A.

The semiconductor module includes a substrate 601, a semiconductor chip 607 mounted at a predetermined position on the substrate, a bonding wire 608 connecting the semiconductor chip to a wiring pattern 603 on the substrate, and an encapsulation resin 609 for sealing the semiconductor chip and the bonding wire.

The substrate 601 includes an insulating substrate 602 and a wiring pattern 603 thereon, and a solder resist 604 is formed on the tip surface of the wiring pattern. Further, the solder resist 604 is provided with a solder resist annular portion 605 formed so as to surround the semiconductor chip and a connecting portion between the semiconductor chip and the wiring pattern 603 and a solder resist removal portion 606 on areas inside and outside the solder resist annular portion. Namely, by providing the solder resist removal portion, a step shape is formed at the outer edge of the solder resist annular portion, and overflowing of the encapsulation resin is suppressed by a surface tension generated in the step shape portion.

Japanese Patent Application Laid-Open No. 2004-327851 discusses a construction configured to stem an encapsulation resin with a wiring pattern.

However, the construction and production method discussed in Japanese Patent Application Laid-Open No. H11-135685 have a disadvantage that in a portion in which a wiring pattern and a solder resist annular portion cross each other and in the vicinity of the portion, an encapsulation resin tends to overflow from the cross portion.

SUMMARY OF THE INVENTION

As a result of vigorously conducting research and development for solving the problems described above, the present inventor has found a semiconductor module having a structure for suppressing overflowing of an encapsulation resin as described below.

Namely, the semiconductor module of the present invention includes at least a semiconductor chip, a substrate on which the semiconductor chip is mounted, and on which a wiring pattern connected to the semiconductor chip and a solder resist are formed, and an encapsulation resin for sealing the semiconductor chip, wherein the solder resist is patterned to have an aperture in which an area in which the semiconductor chip is mounted, and a connecting portion between the semiconductor chip and the wiring pattern are arranged, and to have an outer edge surrounding an outer periphery of the area in which the semiconductor chip is mounted, and the connecting portion between the semiconductor chip and the wiring pattern, so as to suppress overflowing of the encapsulation resin from the inside of the outer edge, and the wiring pattern crosses the solder resist pattern, and wherein the semiconductor module further includes a wiring pattern extended portion extending from the wiring pattern along the outer edge of the solder resist pattern at an outside of the outer edge of the solder resist pattern, and filled with the encapsulation resin up to the outer edge of the solder resist pattern and up to the outer edge of the wiring pattern extended portion.

In this application, the "wiring pattern extended portion" refers to a linear portion extended from the wiring pattern and includes a case where the linear portion has a gap.

According to the present invention, there can be provided a semiconductor module which can reliably suppress overflowing of an encapsulation resin, has excellent production stability, is inexpensive and has an increased yield.

Further features of the present invention will become apparent from the following description of exemplary embodiments with reference to the attached drawings.

DESCRIPTION OF THE EMBODIMENTS

The circumstances that led to the present invention will be described before the embodiments of the present invention are described.

Figure 7A:
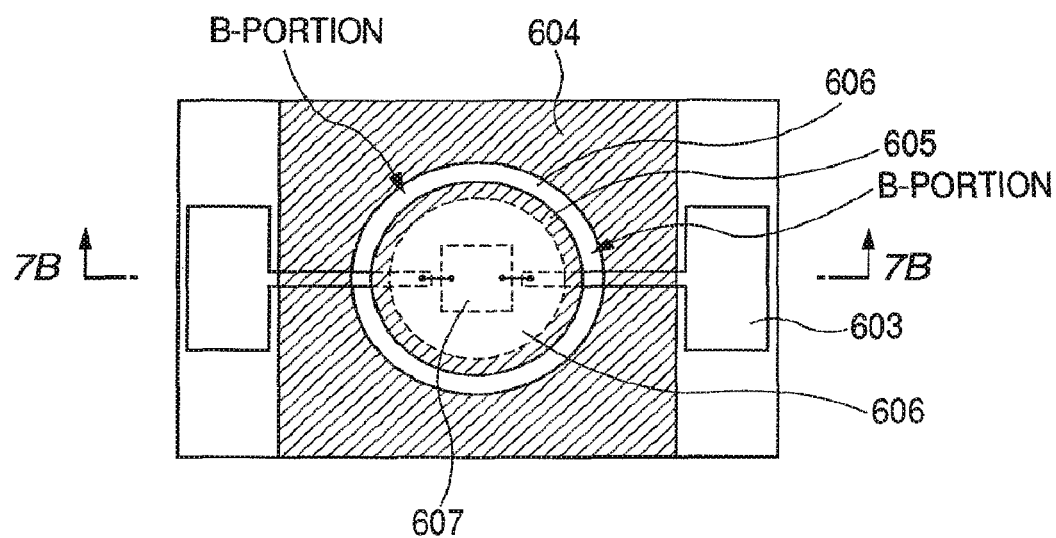
FIGS. 7A and 7B are schematic diagrams illustrating an example of a conventional technique for the present invention.
Figure 7B:
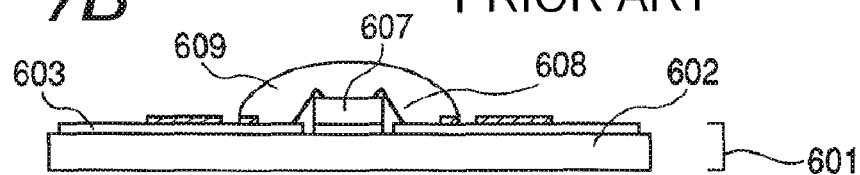

In the configuration of FIGS. 7A and 7B, the reason why an encapsulation resin tends to overflow in a portion in which a wiring pattern and a solder resist pattern cross each other and in the vicinity of the portion is not clear, but can be presumed as follows.

Figure 8:
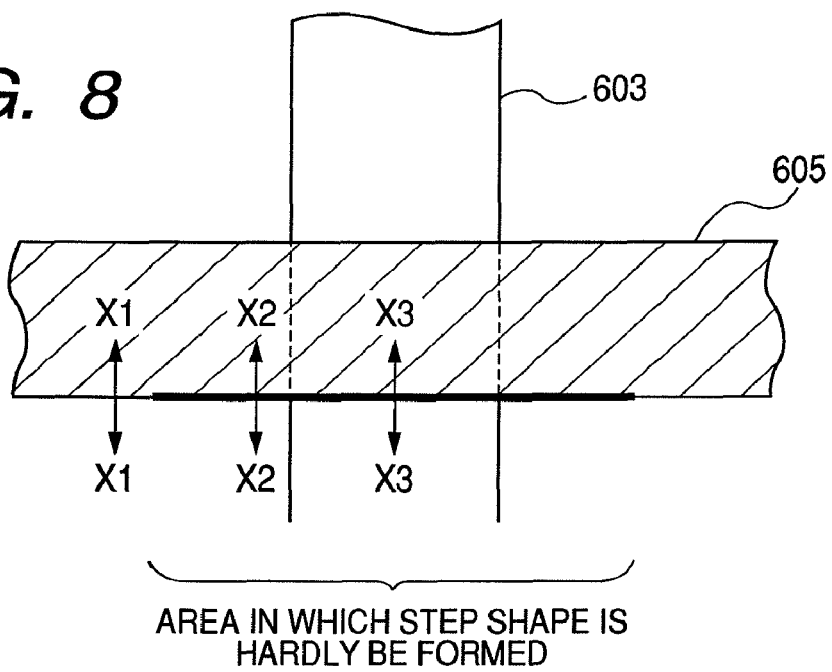
FIG. 8 is a view illustrating a reason why an encapsulation resin tends to overflow from a pattern in which a wiring portion and a solder resist annular portion cross each other.
Figure 9A:
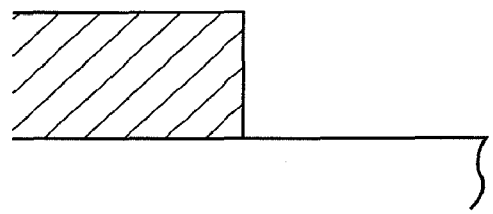
FIGS. 9A, 9B and 9C are sectional views illustrating the reason why the encapsulation resin tends to overflow from a portion in which the wiring portion and the solder resist annular pattern cross each other.
Figure 9B:
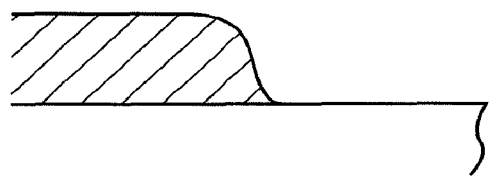
Figure 9C:
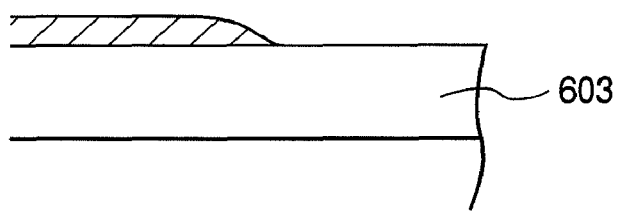

Here, FIG. 8 shows the portion in which the wiring pattern and the solder resist pattern cross each other and the vicinity of the portion. FIGS. 9A, 9B and 9C show a sectional view taken along line X1-X1 in FIG. 8, a sectional view taken along line X2-X2 in FIG. 8 and a sectional view taken along line X3-X3 in FIG. 8, respectively.

A solder resist film is formed normally in a thickness of about 20 μm to 50 μm. Thus, as shown in FIG. 9A, a step shape formed between the solder resist pattern and a solder resist removal portion essentially has a height of about 20 μm to 50 μm. Therefore, the step is sufficient for exerting a surface tension required for suppressing flowing of the encapsulation resin.

However, as shown in FIGS. 7B and 8, the wiring pattern itself has normally a thickness of about 20 μm to 50 μm in a portion in which the wiring pattern and the solder resist pattern cross each other. Therefore, as shown in FIG. 9C, a situation arises in which the solder resist is formed only in a small thickness on the wiring pattern due to the leveling characteristic of the solder resist. Usually, there is a step of forming a gold-plated film on the wiring pattern using the formed solder resist as a mask for improving the bonding characteristic of a wire. In this case, a situation arises in which the step shape of the solder resist is more hardly formed. It is conceivable that the encapsulation resin overflows from the cross portion resulting from the fact that a surface tension is hardly exerted when the step shape by the solder resist is thus hardly formed on the wiring pattern.

The same applies for the vicinity of a portion in which the wiring patter and the solder resist pattern cross each other. The step shape becomes harder to be formed satisfactorily as shown in FIG. 8B as going toward the cross portion under the influence of the cross portion.

Consequently, as shown in FIG. 8, there is an area in which the step shape is hardly formed in a portion in which the wiring pattern and the solder resist annular portion cross each other and in the vicinity of the portion, and it is conceivable that a surface tension is hardly exerted in this area. It is conceivable that the encapsulation resin overflows because the step shape is hardly formed and a surface tension is thus hardly exerted not only in the cross portion but also in the vicinity of the cross portion.

The present inventors have found that by providing a wiring pattern extended portion extending from the wiring pattern, the encapsulation resin is stemmed outside of the solder resist, and overflowing of the encapsulation resin can be thereby suppressed. The reason for this is that since the step shape is formed on an outer edge of the wiring pattern extended portion outside of an outer edge of the solder resist, a surface tension is exerted with the step shape, and overflowing of the encapsulation resin can be thereby suppressed.

The configuration of the semiconductor module according to the first embodiment of the present invention will be described in detail below.

First Embodiment

The first embodiment of the present invention will be described using FIGS. 1A to 4.

Figure 1A:
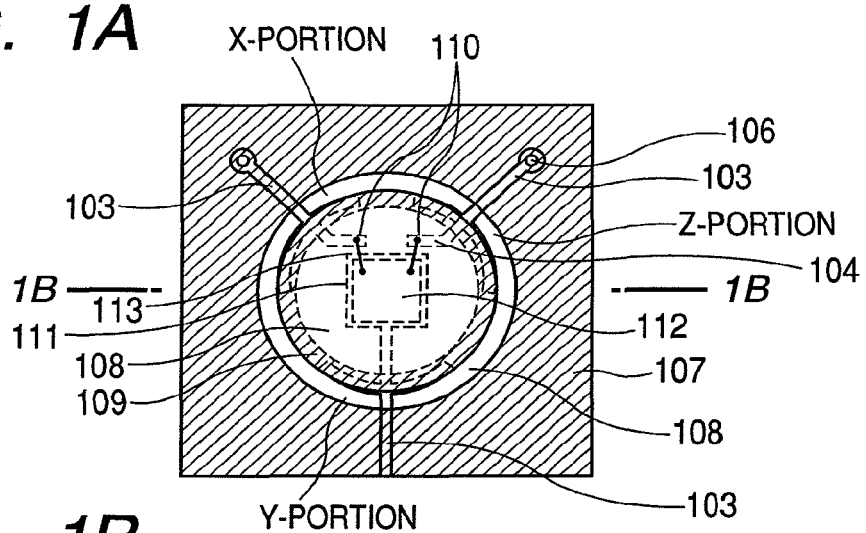
FIGS. 1A and 1B are schematic diagrams illustrating the first embodiment to which the present invention can be applied.
Figure 1B:
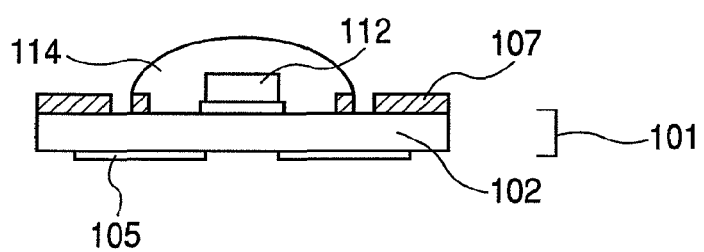

FIG. 1A is a plan view of the semiconductor module illustrating the first embodiment of the present invention, and FIG. 1B is a sectional view taken along line 1B-1B in FIG. 1A.

A substrate 101 includes an insulating substrate 102 represented by, for example, a glass epoxy resin, and a wiring pattern 103 formed on the insulating substrate.

The wiring pattern 103 is a wiring which electrically connects an internal terminal 104 formed inside of an annular solder resist pattern described later and an external terminal 105 formed outside of the annular solder resist pattern. More specifically, the internal terminal 104 includes a wire bonding portion 110 and a die pad portion 111. In this embodiment, the external terminal 105 is formed on the back surface of the substrate as shown in the sectional view, and connected to the internal terminal 104 through a through-hole 106.

The internal terminal 104, the external terminal 105 and the wiring pattern 103 are preferably those prepared by, for example, plating nickel on a copper material and further plating gold thereon, but their material is not specifically limited thereto. The suitable thickness of the internal terminal 104, the external terminal 105 and the wiring pattern 103 is about 20 to 100 μm.

On the wiring pattern 103 is provided a solder resist 107 for protecting the wiring pattern against external factors. The solder resist 107 can be formed into a solder resist layer having a desired pattern by a method in which the solder resist is formed on the entire surface of a substrate, followed by patterning the solder resist using a photo mask or a method in which the solder resist is print-patterned directly on the substrate using a print mask having a desired pattern.

The area 108 shown in the figure is an area in which the solder resist is not formed, and the portion 109 shown in the figure is an annular solder resist pattern. The solder resist pattern 109 is formed simultaneously with the solder resist 107 by the method described above.

Here, the annular shape includes, in addition to the circular shape, shapes close to the circular shape and polygonal shapes including polygons having 4 or more angles. The annular solder resist pattern preferably has a fully closed structure, but a structure that is not fully closed but has a thin aperture (gap) within the bounds of not causing overflowing of the encapsulation resin described later is acceptable. However, as a shape effective for suppressing overflowing of the encapsulation resin by exerting the surface tension of the resin most stably, a closed circular shape is more preferable for the solder resist pattern.

It is not necessarily required that the solder resist pattern has an annular shape. Namely, the solder resist pattern may have any shape as long as it has an aperture in which an area in which a semiconductor chip is mounted, and a connecting portion between the semiconductor chip and the wiring pattern are arranged, and to have an outer edge surrounding an outer periphery of the area in which the semiconductor chip is mounted and the connecting portion between the semiconductor chip and the wiring pattern, so as to suppress overflowing of the encapsulation resin.

The annular shape includes shapes in which the shape of an inner periphery does not coincide with the shape of an outer periphery, and for example, the inner periphery may have a tetragonal shape or an elliptical shape while the outer periphery may have the circular shape. In this case, the outer periphery preferably has the circular shape, but is not necessarily required to have the circular shape. The annular shape is generally considered to have an inner periphery and an outer periphery that are concentric, but this application encompasses a shape having an inner periphery and an outer periphery that are not concentric.

The suitable thickness of the solder resist is about 10 to 120 μm.

On the substrate on which the solder resist is formed in a manner described above, a semiconductor chip 112 is connected to the top of the die pad portion 111, and further, the semiconductor chip 112 and the internal terminal 104 are connected by a bonding wire 113. Thereafter, the semiconductor chip is sealed with an encapsulation resin 114 so as to cover the semiconductor chip 112, the bonding wire 113 and a bonding wire connecting portion.

The suitable material of the encapsulation resin 114 that is used is, for example, a resin having excellent flowability, such as an epoxy resin, but the material of the encapsulation resin 114 is not limited thereto. The suitable method of sealing that is used is, for example, a dispenser method or a printing method.

In the case of the dispenser method, for example, a method is used in which a predetermined amount of resin is dropped from just above the semiconductor chip 112 using a needle. At this time, the resin spreads outward immediately after it is dropped, but overflowing of the encapsulation resin can be suppressed by the surface tension of the encapsulation resin, since the outer edge of the annular solder resist pattern 109 is formed to have an almost perpendicular step shape.

In the case of the printing method, for example, a method is used in which printing is performed using a print mask having an aperture having an area somewhat smaller than that of the annular solder resist pattern 109. In this case, the resin spreads as in the dispenser method, but overflowing of the resin can be suppressed in the portion of the annular solder resist pattern 109 based on the same principle.

Suppressibility of overflowing of the resin in a portion in which the annular solder resist pattern and the wiring pattern cross each other and in the vicinity of the portion will now be described in detail. In this embodiment, a wiring pattern extended portion is provided along the outer periphery of the annular solder resist pattern in the vicinity of a portion in which the annular solder resist pattern and the wiring pattern cross each other. In FIG. 1A, portion X, portion Y and portion Z correspond to the wiring pattern extended portion.

Figure 2:
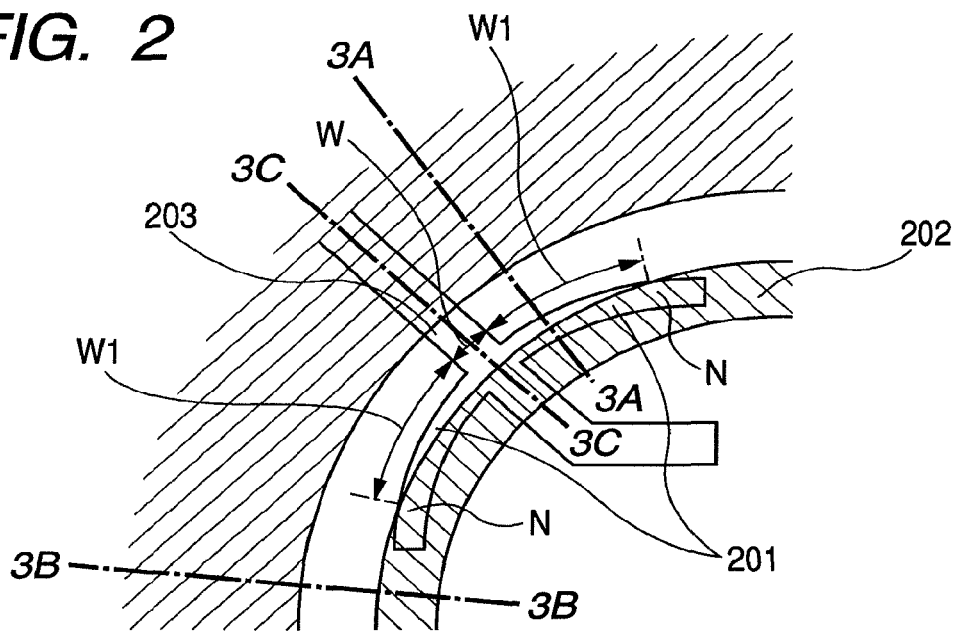
FIG. 2 is a schematic diagram illustrating a wiring pattern extended portion to which the present invention can be applied.
Figure 3A:
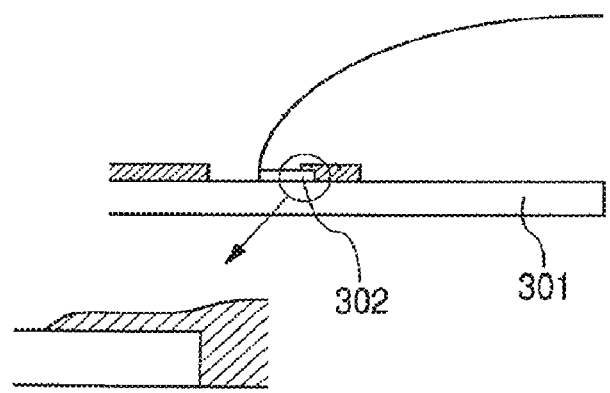
FIGS. 3A, 3B and 3C are sectional schematic diagrams illustrating suppression of overflowing in the first embodiment to which the present invention can be applied.
Figure 3B:
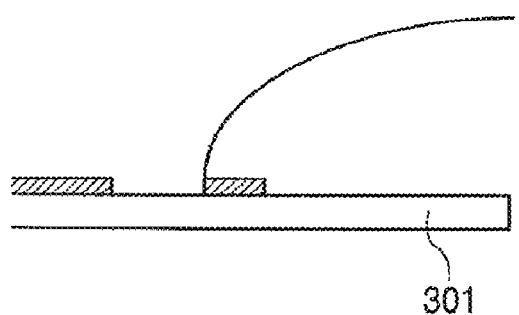

FIG. 2 is an enlarged view of the portion X in FIG. 1, FIG. 3A is a sectional view of taken along line 3A-3A in FIG. 2, and FIG. 3B is a sectional view taken along line 3B-3B in FIG. 2.

In FIG. 2, a wiring pattern extended portion 201 is a wing-like line portion provided along the outer periphery of a solder resist pattern 202 on the outer periphery of the annular solder resist pattern 202.

The wiring pattern extended portion 201 extends along the outer periphery, and superimposes the annular solder resist pattern 203. Namely, a part of the line lies under the annular solder resist pattern 203, and the other part of the line does not lie under the annular solder resist pattern. The length and width of the wiring pattern extended portion 201 are not specifically limited. However, the length of the outer edge of the wiring pattern extended portion provided on the outer periphery of the solder resist pattern, i.e. the length (W1) of the outer edge of the wiring pattern extended portion is desirably equal to or greater than the width (W) of the wiring pattern (W1≧W). The area in which the step shape is hardly formed in FIGS. 7A and 7B (area having a cross-section in FIG. 8B) is considered to have a width approximately equal to the width (W) of the wiring pattern depending on the material of the encapsulation resin. Therefore, the length (W1) of the wiring pattern extended portion which superimposes the solder resist pattern may be set so as to satisfy W1≧W.

Even if the encapsulation resin overflows across the solder resist pattern 202 which is the area in which the step shape is hardly formed in the cross portion and in the vicinity of the cross portion, the encapsulation resin can be stemmed by the surface tension owing to the step shape on the edge of the wiring pattern extended portion formed to have a length W1.

Even if the line of the wiring pattern extended portion 201 is divided (has a gap) within the bound of retaining the surface tension of the encapsulation resin, there is no particular problem. However, for improving the suppressibility of overflowing of the encapsulation resin, the extended portion preferably include a line having an arc shape in terms of the surface tension. The tip of the line preferably lies under the annular solder resist pattern. If the wiring pattern extended portion includes a line having an arc shape, the wiring pattern extended portion is preferably shaped to have a radius of curvature that is smaller than the radius of curvature of the annular solder resist pattern and close to the radius of curvature of the annular solder resist pattern.

By giving such a shape, the encapsulation resin can be stemmed because a surface tension is exerted in the step shape of the arc pattern of the extended portion even if the resin overflows from the solder resist portion on the wiring pattern. By reducing the radius of curvature, the wiring pattern extended portion can be easily shaped such that the tip of the line lies under the annular solder resist pattern. By having a radius of curvature which is close to the radius of curvature of the annular solder resist pattern, a portion N in which the outer edge of the wiring pattern extended portion crosses the outer edge of the annular solder resist pattern has a shallow angle (sharp angle shape). Such a sharp angle shape prevents exertion of an extreme surface tension on the resin, and therefore the suppressibility of overflowing can be improved.

Figure 3C:
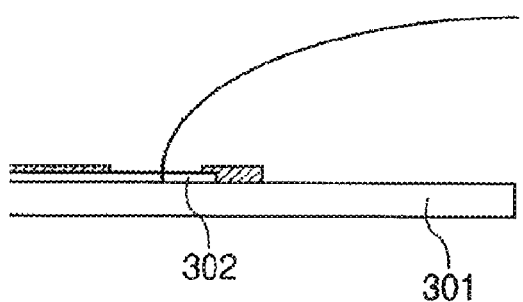

FIG. 3A is a schematic diagram illustrating the resin being stemmed in the cross-section taken along line 3A-3A in FIG. 2. FIG. 3B is a schematic diagram illustrating the resin stemmed in the cross-section taken along line 3B-3B in FIG. 2. FIG. 3C is a schematic sectional view illustrating the cross-section of the cross portion in the cross-section taken along line 3C-3C in FIG. 2.

Since the step shape by the wiring pattern extended portion is properly formed in the case of FIG. 3A, and the step shape by the annular solder resist pattern is properly shaped in the case of FIG. 3B, overflowing of the encapsulation resin can be sufficiently suppressed. The encapsulation resin can be filled up to the outer edge of the solder resist pattern and up to the outer edge of the wiring pattern extended portion.

Second Embodiment

The second embodiment of the present invention is same as the first embodiment except that a double structure is provided as an example of multiple solder resist patterns.

Figure 4:
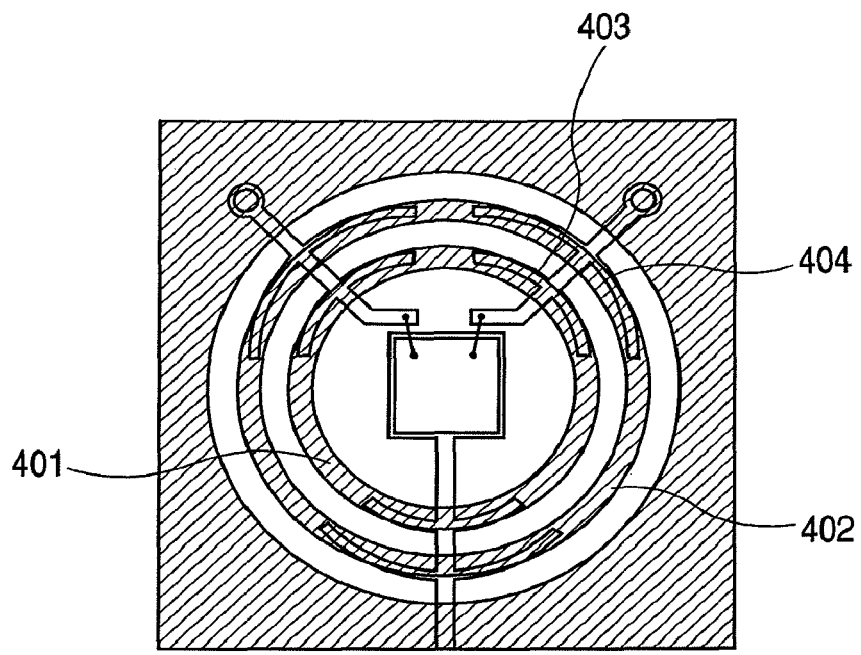
FIG. 4 is a schematic diagram illustrating the second embodiment to which the present invention can be applied.

FIG. 4 is a plan view of a semiconductor module illustrating the second embodiment of the present invention.

FIG. 4 shows a first annular solder resist pattern 401 and a wiring pattern extended portion 403 provided along the outer periphery of the first solder resist pattern, and their shapes can be similar to those in the first embodiment.

Furthermore, FIG. 4 shows a second annular solder resist pattern 402 and a wiring pattern extended portion 404 provided along the outer periphery of the second solder resist pattern, and their shapes can also be similar to those in the first embodiment.

By providing such a double structure, the bank can be doubled, and therefore the probability of suppressing overflowing can be further improved to contribute to an increase in yield.

Third Embodiment

The third embodiment of the present invention is same as the first embodiment except that a part of the wiring pattern extended portion has a gap (slit).

Figure 5:
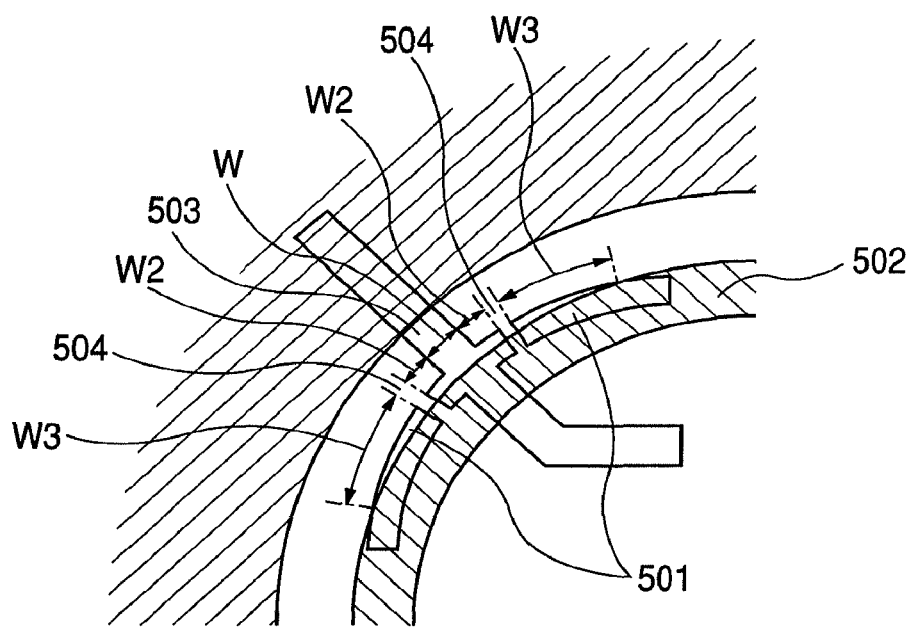
FIG. 5 is a schematic diagram illustrating the third embodiment to which the present invention can be applied.

FIG. 5 is a schematic diagram of the wiring pattern extended portion illustrating the third embodiment of the present invention.

FIG. 5 shows a wiring pattern extended portion 501, an annular solder resist pattern 502, a wiring pattern 503 and a gap 504 of the wiring pattern extended portion. The gap of the wiring extended portion is acceptable as long as the surface tension of the encapsulation resin can be retained. For example, a gap having a width of about 100 to 500 μm does not affect an effect that can be obtained. The length and width of the wiring pattern extended portion 501 are not specifically limited. However, the length of the outer edge of the wiring pattern extended portion provided on the outer periphery of the solder resist pattern can be optimized. Namely, the length (w2+w3) of the outer edge of the wiring pattern extended portion, which does not superimpose the solder resist pattern, is desirably equal to or greater than the width (W) of the wiring pattern ((W2+w3)≧W). The area in which the step shape is hardly formed in FIGS. 7A and 7B (area having a cross-section in FIG. 8B) is considered to have a width which is approximately equal to the width (W) of the wiring pattern at most depending on the material of the encapsulation resin. Therefore, if the length (W2+W3) of the portion of the wiring pattern extended portion which does not superimpose the solder resist pattern is set so as to satisfy (W2+W3)≧W, the encapsulation resin can be stemmed.

Figure 6:
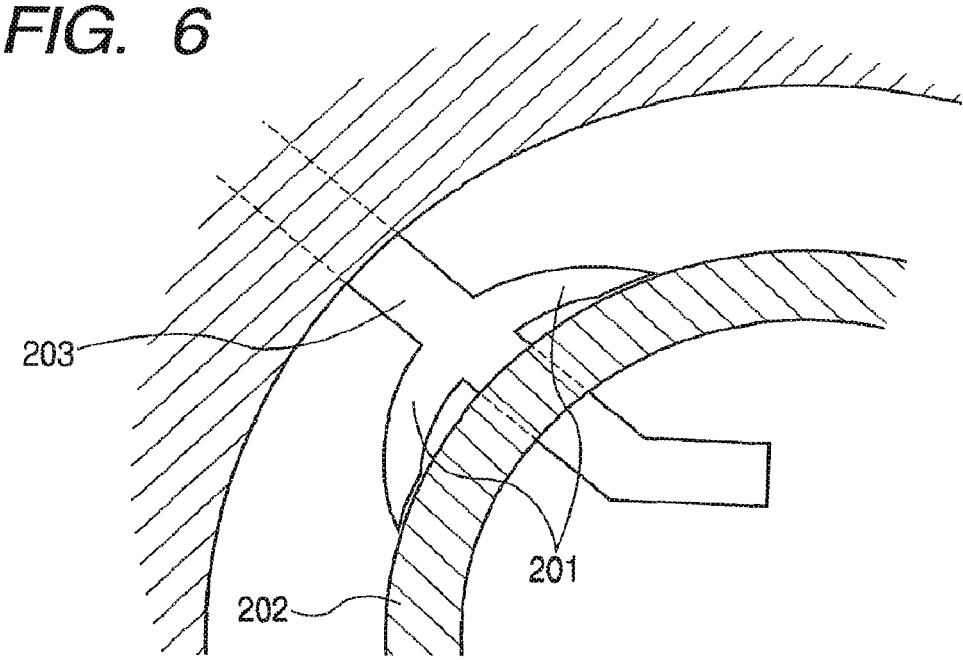
FIG. 6 is a schematic diagram of a wiring pattern extended portion illustrating another embodiment to which the present invention can be applied.

In the embodiments described above, the wiring pattern extended portion lies under the solder resist pattern. However, according to the technical concept of the present invention, the step shape may be formed at the outer edge of the wiring pattern extended portion on the outer periphery side from the solder resist pattern. Therefore, as shown in FIG. 6, it is not necessarily required that the wiring pattern extended portion 201 lie under the solder resist pattern 202.

In the embodiments described above, the wiring pattern extended portion is provided at opposite sides of the wiring pattern, but even if the wiring pattern extended portion is provided only at one side of the wiring pattern, there can be obtained an effect of stemming the encapsulation resin at the side.

The present invention is used for a semiconductor module having a suppressive structure for suppressing overflowing of an encapsulation resin from a predetermined area of a substrate when sealing a semiconductor chip with the encapsulation resin.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-351926, filed Dec. 27, 2006, which is hereby incorporated by reference herein in its entirety.

What is claimed is:

1. A method of manufacturing a semiconductor module, comprising steps of:
   preparing a semiconductor chip;
   preparing a substrate having a connecting portion, a wiring pattern connected to connecting portion, wherein the wiring pattern has a wiring pattern extended portion extending to cross a part of the wiring pattern, the wiring pattern having a first edge at a side of the connecting portion and a second edge at a side opposite to the side of the connecting portion, and a solder resist arranged at a periphery of the connecting portion to cover the wiring pattern such that an outer edge of the solder resist is arranged along the wiring pattern extended portion at the side of the second edge;
   mounting the semiconductor chip on an inside part of the solder resist of the substrate; and
   applying an encapsulation resin to cover the semiconductor chip.

2. The method according to claim 1, wherein, in the step of applying the encapsulation resin, the second edge of the wiring pattern extended portion serves to stop the encapsulation resin from flowing over an outer edge of the solder resist on the wiring pattern.

3. The method according to claim 1, wherein the solder resist is patterned in an annular shape.

4. The method according to claim 3, wherein the solder resist patterned in the annular shape is multiplicated.

5. The method according to claim 4, wherein the wiring pattern extended portion is shaped into an arc shape, which has a radius of curvature smaller than a radius of curvature of the outer edge of the solder resist.

6. The method according to claim 1, wherein the outer edge of the wiring pattern extended portion at the outside of the outer edge of the solder resist is longer than a width of the wiring pattern.

7. The method according to claim 1, wherein a wiring pattern extended portion is disposed at each side of the wiring pattern.

8. The method according to claim 1, wherein, in the step of applying the encapsulation resin, the encapsulation resin is applied such that a flowing of the encapsulation resin is stopped by an outer edge formed by the wiring pattern extended portion at the side of the second edge and the outer edge of the solder resist.

* * * * *